(12) United States Patent
Jou et al.

(10) Patent No.: US 6,594,814 B1
(45) Date of Patent: Jul. 15, 2003

(54) DYNAMIC PIPELINING APPROACH FOR HIGH PERFORMANCE CIRCUIT DESIGN

(75) Inventors: Jer Min Jou; Shiann-Rong Kuang, both of Tainan (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/474,611

(22) Filed: Dec. 29, 1999

(51) Int. Cl.$^7$ ............................................... G06F 17/50
(52) U.S. Cl. .................................. 716/18; 716/1; 716/7
(58) Field of Search ............................. 716/18, 3, 7, 1; 700/8, 9, 11, 12, 20, 28; 717/600; 712/216, 220, 225, 229, 233, 241, 245

(56) References Cited

U.S. PATENT DOCUMENTS

| | | | | |
|---|---|---|---|---|
| 5,778,250 A | * | 7/1998 | Dye ............................. | 712/32 |
| 5,918,042 A | * | 6/1999 | Furber ......................... | 713/600 |
| 6,275,969 B1 | * | 8/2001 | Lakshminarayana et al. | 716/2 |
| 6,298,472 B1 | * | 10/2001 | Phillips et al. ............... | 716/18 |

OTHER PUBLICATIONS

Jou et al, "A New Pipelined Architecture for Fuzzy Color Correction," IEEE, Jan. 1999, pp. 209–212.*

Tseng et al, "A New Tru–Single–Phase–Clocking BiCMOS Dynamic Pipelined Logic Family For High–Speed Low––Voltage Pipelined System Applications," IEEE, Jan. 1999, pp. 68–79.*

Jou et al., "Pass: A Package For Automatic Scheduling And Sharing Pipelined Data Paths," p. 4, 1991.

Adam et al., "A Comparison of List Schedules For Parallel Processing Systems," Communications of the ACM, University of Texas at Austin (Austin, Texas), vol. 17 (No. 12), p. 6, (Dec. 29, 1974).

E.F. Girczyc, "Loop Winding—A Data Flow Approach to Functional Pipelining," (Dec. 29, 1987).

Potasman et al., "Percolation Based Synthesis," 27th ACM/IEEE Design Automation Conference, vol. 25 (No. 1), p. 6, (Dec. 29, 1990).

Jun, et al., "Automatic Synthesis of Dynamically Configured Pipelines Supporting Variable Data Initiation Intervals," IEEE Transactions on Very Large Scale Integrations (VLSI) Systems, Sogang University (Seoul, Korea), vol. 4 (No. 2), p. 7, (Dec. 29, 1996).

Rim et al., "Valid Transformations: A New Class of Loop Transformations for High–Level Synthesis and Pipelined Scheduling Applications," IEEE Transactions on Parallel And Distributed Systems, vol. 7 (No. 4), p. 12, (Dec. 29, 1996).

* cited by examiner

*Primary Examiner*—Vuthe Siek
(74) *Attorney, Agent, or Firm*—Gene Scott-Patent Law & Venture Group (57) ABSTRACT

Pipelining is a well-known efficient technique for optimally designing high performance digital circuits. However, conventional pipelining techniques are difficult to pipeline the execution of a loop with variant iteration execution lengths in a circuit. The invention presents a new pipeline design approach, called dynamic pipelining, to design and pipeline this kind of loop in a circuit efficiently. Instead of assuming a fixed latency (or data initiation interval), the approach pipelines the loop using run-time determined latencies to achieve a high performance. The general controller architecture of it is also introduced. It consists of two interactive finite state machines to allow the pipeline datapath to execute at variant latencies. Experimental results show that the approach can obtain about 2 times speedup with acceptable area overhead.

9 Claims, 12 Drawing Sheets

| | | |
|---|---|---|
| $S_1$: | j=1; | $O_1$ |
| $S_2$: O_loop: | if ($N \leq j$) goto End_O; | $O_2$ |
| | i=j-1; | $O_3$ |
| | r_add=j; | $O_4$ |
| | j++; | $O_5$ |
| $S_3$: | temp=a[r_add]; | $O_6$ |
| $S_4$: I_loop: | r_add=i; | $O_7$ |
| $S_5$: | data=a[r_add]; | $O_8$ |
| $S_6$: | w_add=i+1; | $O_9$ |
| | if (!(temp<data && i$\geq$0)) goto End_I; | $O_{10}$ |
| $S_7$: | a[w_add]=data; | $O_{11}$ |
| | i=i-1; goto I_loop; | $O_{12}$ |
| $S_8$: End_I: | a[w_add]=temp; goto O_loop; | $O_{13}$ |
| End_O: | | |

DYNAMIC PIPELINING APPROACH FOR HIGH PERFORMANCE CIRCUIT DESIGN

FIELD OF THE INVENTION

The invention presents a new method for high performance hardware circuit pipelining; by using the said dynamic pipelining method, it is capable of enabling variant-iteration-execution-time circuits in run-time determined latencies to achieve the optimal pipeline speed.

BACKGROUND OF THE INVENTION

Getting a higher performance is one of the most important goals of designing Application Specific Integrated Circuits (ASIC's). The action of an ASIC often contains the time-consuming loops. To optimize the performance efficiently, the parallelism hidden in the repetitive loops must be located, and then pipelined. In the past, many pipelining techniques have been developed to explore the parallelism of loops in an ASIC. Functional pipelining, proposed by many people such as E. M. Circzyc (in the *Proc. of the International Symposium Circuits and Systems*(ISCAS), pp. 382–385, in 1987.), is used to pipeline the execution of the loop with acyclic iterations. On the other hand, loop pipelining or software pipelining, such as the methods revealed by A. Aiken et. al. (in *Proc. ACM SIGPLAN'88 Conf.* on Prog. Lang. Design and Implementation, 1988.) and by M. Lam (in *Proc. ACM SIGPLAN'88 Conf* on Prog. Lang. Design and Implementation, pp.318–328, 1988.), is applied to explore the parallelism across iterations of the loop with cyclic iterations. Structured pipeline uses the pipelined functional units to prompt the ASIC performance. Other approaches such as that proposed by J. P. Sheu, et. al. (in *IEEE Trans. on Parallel and Distributed Systems*, Vol. 2, No. 3, July 1991.) have been proposed to find the potential parallelism of nested loops. In addition, many patents have proposed different pipelining methods for enhancing circuit performance such as U.S. Pat. Nos: 4,677,549, 4,742,453, 5,079,736, 5,428,756, and 5,684,422. However, these approaches might handle only nested loops with constant loop-iteration numbers and the execution time of each iteration in them is fixed.

DESCRIPTION OF THE PRIOR ART

For a pipeline design, consecutive two iterations of a loop are initiated at a time interval called latency. In existing pipelining techniques, the latencies of a pipeline are all set as a fixed value or some fixed values. However, in the loops of many ASICs, variant iteration execution time and time-relative data dependencies between different iterations make them to be impossibly or inefficiently pipelined, because the values of the pipeline latencies cannot be fixed and be known in advance. To solve such problems, the fixed latency assumption must be removed and more flexibility is needed. Here, a new pipeline design approach for high performance ASICs, called dynamic pipelining, is invented to pipelinely designing those ASIC loops using variant latencies efficiently.

The invention is even more suitable for the circuit's loops with the factor of inconsistent execution time for each iteration and/or the number of iterations unfixed. The traditional pipelining approach cannot resolve such problems, while by using the variant latencies pipeline of the invention, the pipelining of time-variant loops and then time-efficiency of the circuit can be successfully achieved.

Moreover, the cost of hardware using the proposed design method is at the same class as that of the traditional pipelining design: it would increase the quantity of state registers, certain hardware components as well as the complexity of its control circuit. The amount of these increased hardware components varies according to the different designs, and cannot be quantitatively explained. Despite which, it is generally acceptable just as the design of conventional pipelining has been, which could be seen from the results of our empirical study.

SUMMARY OF THE INVENTION

The object of the invention is to expose a new type of pipelining method applicable for high performance digital circuits. By using the said dynamic pipelining method, it can effectively pipeline circuits of time-variant loops in run-time determined latencies to achieve the goal the optimal pipeline speed.

In addition, the invention further proposes a coordinated type of controller for the dynamic pipelined circuit, which consists of two coordinated finite state machines and enables the dynamic pipelined datapath to execute at variant latencies.

All those acquainted with the skill of pipelining will undoubtedly be very clear of the objective and advantages revealed by the invention after the going over the explanation and the examples cited in the following along with the drawings.

BRIEF DESCRIPTION OF THE DRAWINGS

Table 1. The Compared Results of Processing Speeds for Sequential & Dynamic Pipelining Binary Arithmetic Coding Circuits.

Table 2. The Compared Results of Processing Speeds for Sequential & Dynamic Pipelining Insertion Sorters.

Table 3. The Compared Results of Processing Speeds for Sequential & Dynamic Pipelining Fuzzy Color Correction Circuits.

FIG. 3. The Partitioned Results of The BSTG in FIG. 2

(a) Outer $BSTG_o$, and (b) Inner $BSTG_i$

FIG. 4.

(a). Original $PBSTG_i$, and (b). New $PBSTG_i$ After Removing States in Prelude and Postlude.

DESCRIPTIONS OF DRAWING NUMBERING

1 Inner Section Loop
2 Repeating Pipeline Body
3 Inner Controller
4 Combinational Logic
5 State Registers
6 Outer Controller 8 Control Signals
9 Other Conditions
10 from (or to) Datapath
11 donē
12 done
13 s̄tart
14 start
15 Noop$_i$
16 Noop$_o$
31 Eq. [4]
41 MUX
61 Eq. [3]
71 Eq. [5]

DETAIL DESCRIPTION OF THE INVENTION

The invention presents a new pipeline design approach, called "dynamic pipelining", using variant latencies to effectively enable pipelining of time-variant loops, and achieves double layer pipelining effects through appropriate control signal generating. The additional cost requirement needed is merely small increase of hardware.

Graph Models and Definitions of Dynamic Pipelining

Firstly, the behavioral state transition graph (BSTG), which models the behavior of an ASIC to be dynamically pipelined, is described hereunder. A BSTG is a directed cyclic graph that uses vertices for states and edges for state transitions. Each vertex in BSTG has two labels $S_i$, which denotes the ith state of the BSTG, and some condition-operation pairs [c:ϵ], which denote that the set of operations ϵ will be executed if corresponding control condition c in the state is true. If all ϵ are null, the corresponding state is a no-operation state denoted as Noop. The edge labels in BSTG are the control conditions that cause a transition from one state to another. The operations in a state will be activated within the same clock cycle. In BSTG, if a data value d is produced by some operation at state $S_i$ of BSTG, then we say $S_i$ produces d. If any operation at state $S_j$ of BSTG receives d as input to calculate its result, then we say $S_j$ consumes d. The lifetime of data value d in BSTG is a span from the state which produces d to the last state which consumes d. If there is an edge $S_i \rightarrow S_j$ in BSTG, then state $S_i$ is called the parent state of $S_j$ and state $S_j$ is called the child state of $S_i$. The state having more than one child state is a branch state; each time only one of the child states will be reached. The decision of which child state is chosen to reach is taken according to the control condition attached to the corresponding edge.

For a pipeline design of the ASIC loop, consecutive two iterations of it are initiated at a time interval called latency, which is represented by the number of states (clock cycles). For distinguishing the states in different iterations of BSTG, the state $S_i$ in the iteration j of BSTG is attached a subscript j as $S_{ij}$. After pipelining, the pipelined ASIC loop's behavior is then expressed as pipelined BSTG, denoted as PBSTG. In PBSTG, each state includes some BSTG states, and has a label $PS_i$ denoting the i-th state of the PBSTG. In the following, an insertion sorting ASIC is used as an example to explain the whole design process of the proposed dynamic pipelining method. The C-like behavioral description of the insertion sorting circuit is given as follows:

j=1;
L1: while (N>j){ /* N is the number of data which needs to be sorted */
  i=j-1;
  temp=a[j];
  L2: while (temp<a[i]&& i>0){
    a[i+1]=a[i];
    i=i-1;
  }
  a[i+1]=temp;
  j++;
}

Figure 1:
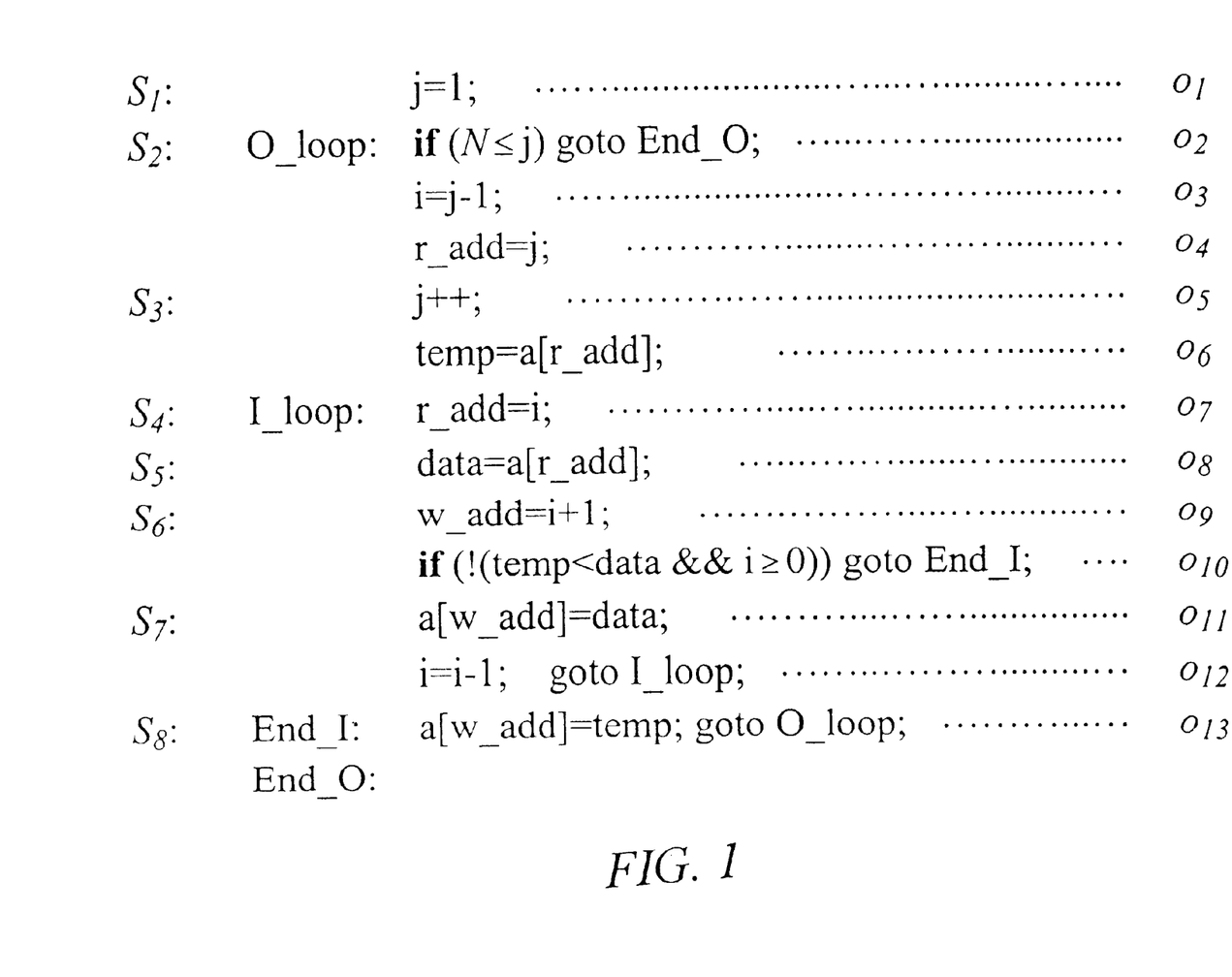
FIG. 1. Hardware Behavioral Description of The Insertion Sorter.
Figure 2:
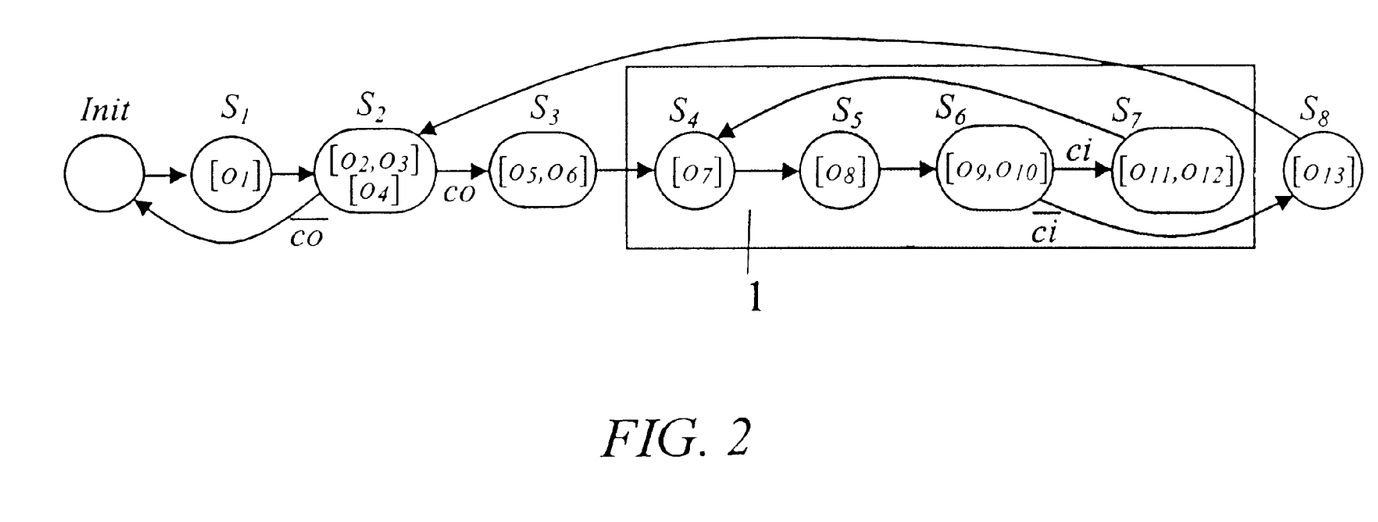
FIG. 2. Initial BSTG of The Insertion Sorter.

The description above is first translated into a hardware behavioral description as shown in FIG. 1. For the sake of simplicity but without losing the generality, the invention assumes that each operation is completed in one clock cycle and a multiport memory is used, the hypotheses shall not affect the design procedures of the invention. In FIG. 1, the r_add (w_add) denotes the reading (writing) address of the memory, the operation in line i is denoted as $o_i$; operation $o_i$ will be activated at the state designated in the beginning of each line. The corresponding initial BSTG of the behavioral description of FIG. 1 is shown in FIG. 2. The control conditions co and ci in FIG. 2 are produced by the inverse results of operations $o_2$:N≦j and $o_{10}$:!(temp<data && i≧0) respectively and we have co=$\overline{o_2}$ and ci=$\overline{o_{10}}$; and there is a variant-execution-time inner loop, whose iteration number is data dependent and is run-time determined, in the BSTG. If condition co (ci) is true, the outer (inner) loop will continue to execute; otherwise, the loop will terminate its execution. The initial state is labeled "Init". Pipelining this sorting circuit (or BSTG) in a fixed latency is impossible due to the variant-execution-time inner loop, and dynamic pipelining using run-time determined latencies is essential.

Dynamic Pipelining Design Method

To design the dynamic pipeline circuit, the invention first uses BSTG to model the ASIC loops having variant iteration execution time, and then partitions the loops modeled with BSTG into two parts: an inner section and an outer section. These operations that make the inner loop's iteration execution time variable are grouped into the inner section, and the remaining operations are grouped into the outer section. The inner section may be a condition branch with multiple execution paths and/or a variant-iteration-execution-time loop. The two sections are then modeled with two interactive BSTG's. In BSTG of the outer (inner) section, the whole inner (outer) section is viewed as a no-operation vertex. After BSTG partitioning, the inner and outer sections are serially pipelined into two pipelined BSTG's, PBSTG's, to combine a dynamic pipeline. After dynamic pipelining, the two sections may execute concurrently when their precedence relations don't conflict, the latencies of the pipeline generated are dependent on the execution clock cycles of each inner section iteration and are unfixed naturally, and so the performance improvement by using dynamic pipelining is significant. The controller architecture to sequence the operations of the dynamic pipelining datapath is then derived from the two interactive PBSTGs. Thus, it consists of two interactive finite state machines: the outer and the inner controllers, which control the operations of the outer and the inner sections, respectively. The two controllers may send the different control signals to the same resource (e.g. ALU, register, or multiplexer), a simple mechanism is developed to solve the control conflicts. An integrated controller can also be designed after combining the two PBSTGs.

Based on the aforementioned concept and description, we explain the idea and design steps of dynamic pipelining for an ASIC as follows. Given an initial BSTG of the ASIC, the proposed dynamic pipelining design method performs the following main steps to construct a dynamic pipelined architecture of it using variant latencies:

Step 1: Segmentation of BSTG: Partition and transform the initial BSTG into two interactive subparts: the outer section $BSTG_o$ and the inner loop $BSTG_i$;

Step 2: Pipelining design of the inner section: pipeline the BSTG of the inner section, $BSTG_i$, into a more compact pipelined BSTG, $PBSTG_i$, without violating its data/control dependencies and hardware constraints set by designers;

Step 3: Pipelining design of the outer section: Pipeline the BSTG of the outer section, $BSTG_o$, into a more compact pipelined BSTG, $PBSTG_o$, without violating any data and control dependencies in it and between it and $PBSTG_i$ as well as hardware constraints;

Step 4: Design of pipelined datapath: Perform resource allocation to construct the dynamic pipelined datapath;

Step 5: Design of dynamic pipeline controller: Based on the results above, construct the dynamic pipeline controller to sequence the hardware units of the pipelined datapath.

The instance of insertion sorter cited above will be applied in describing each of the design steps in detail as given below.

Step 1—Segmentation of BSTG

Figure 3:
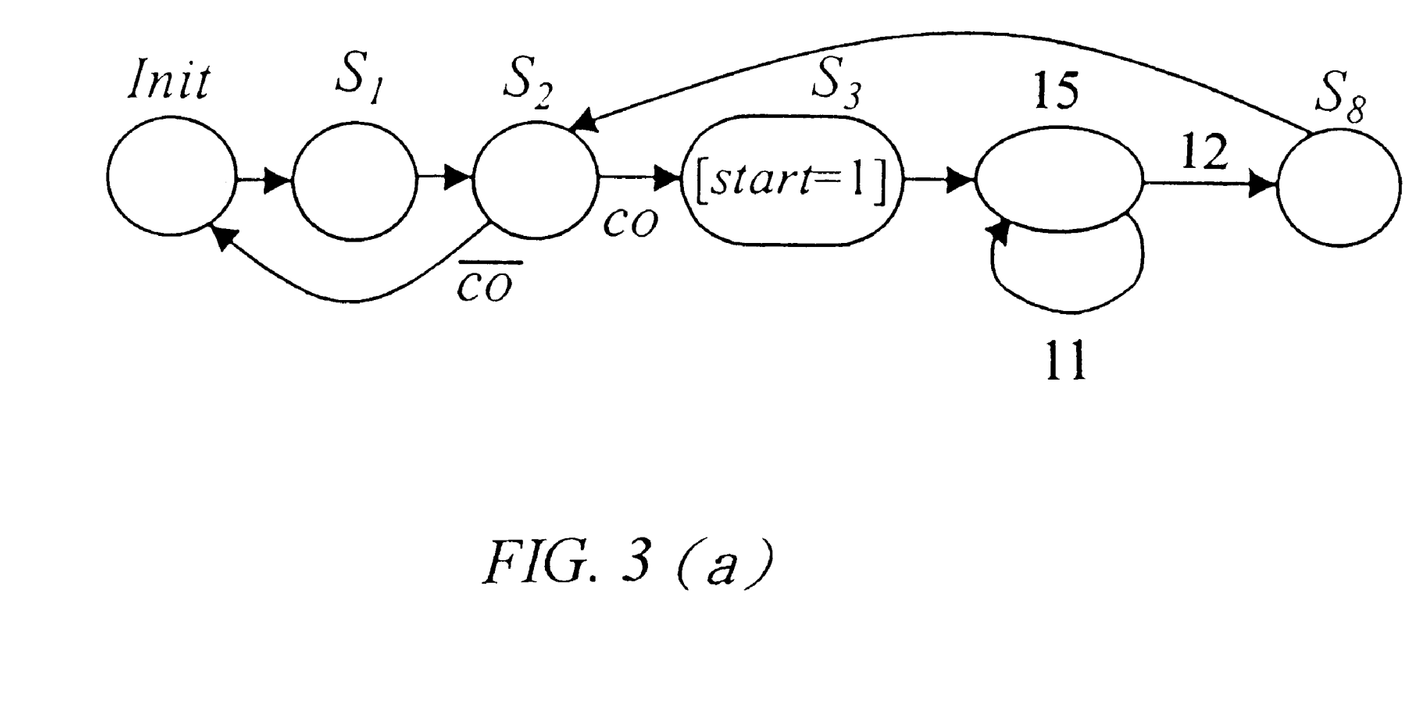

To begin with, the invention first partitions the initial BSTG, which models the behavior of an ASIC to be dynamically pipelined, into two interactive BSTG's: one is the outer section $BSTG_o$; the other is the inner section $BSTG_i$, and then two interactive signals start and done are added between them for their dynamic communications (see FIG. 2 and 3). Those states whose operations make the inner loops' iteration execution time variant are grouped into the inner section, and the remaining states and operations are grouped into the outer section. In the $BSTG_o$, the original location of the inner section is replaced by a new Noop state $Noop_i$ (15) which is a branch state and is added with two outgoing edges labeled with signal conditon done to the next state and done to itself, respectively. Signal done is enabled, i.e., set to 1, by $BSTG_i$ to represent the finish of the inner section's work and to inform $BSTG_o$ the condition. Moreover, another signal start must be added and be set to 1 at the parent state of $Noop_i$ (15) in $BSTG_o$ to initiate the execution of $BSTG_o$ and is disabled i.e., set to 0, at other $BSTG_i$ states. In the $BSTG_i$, on the other hand, the original location of the outer section is also replaced by another Noop state $Noop_o$ (16) which is also added two outgoing edges labeled with signal conditon start to a certain state and start to itself, respectively.

Using the insertion sorter above as an example, after dividing the BSTG in FIG. 2, the result is as shown in FIG. 3; (a) is the outer $BSTG_o$ while (b) is the inner $BSTG_i$. Two interactive signals start and done for their communication are added. By the cooperation of signals start and done, the BSTGs of outer and inner sections have the equivalent behavior as the original BSTG. Note, the interactive scheme set by signals start and done basically keeps the executions of the outer and inner sections to be mutually exclusive in nature. In other words, when the operations of $BSTG_o$ ($BSTG_i$) are activated, no $BSTG_i$ ($BSTG_o$) operation is activated. However, after dynamic pipelining some states of $BSTG_i$ and $BSTG_i$ may execute concurrently. In $BSTG_i$ of FIG. 3(a), signal start is enabled at parent state $S_3$ of $Noop_i$ and is disabled at the other states. In $BSTG_i$ of FIG. 3(b), signal done is enabled by operation $o_{10}$ (i.e., $\overline{ci}$) at $S_6$ and is disabled at the other states.

Step 2—Pipelining Design of The Inner Section

After partitioning the initial BSTG, the $BSTG_o$ and the $BSTG_i$ can be serially pipelined with fixed latencies (Note, the final pipeline combined from the $BSTG_o$ and $BSTG_i$ pipelines is with variant latencies) under different constraints. Pipelining the inner section is easier than pipelining the outer section, because the inner section can be pipelined without regard to the interaction and precedence constraints between it and the outer section temporarily. Therefore, the inner section can be directly pipelined under resource and time constraints by using the conventional pipelining technique as revealed in Proc. of the ISCAS, pp. 1769–1772, 1991, by the inventors. Note that signal done must be set to 1 at state $Noop_o$ of $PBSTG_i$ to inform $BSTG_o$ that $PBSTG_i$ has finished its work.

Figure 4:
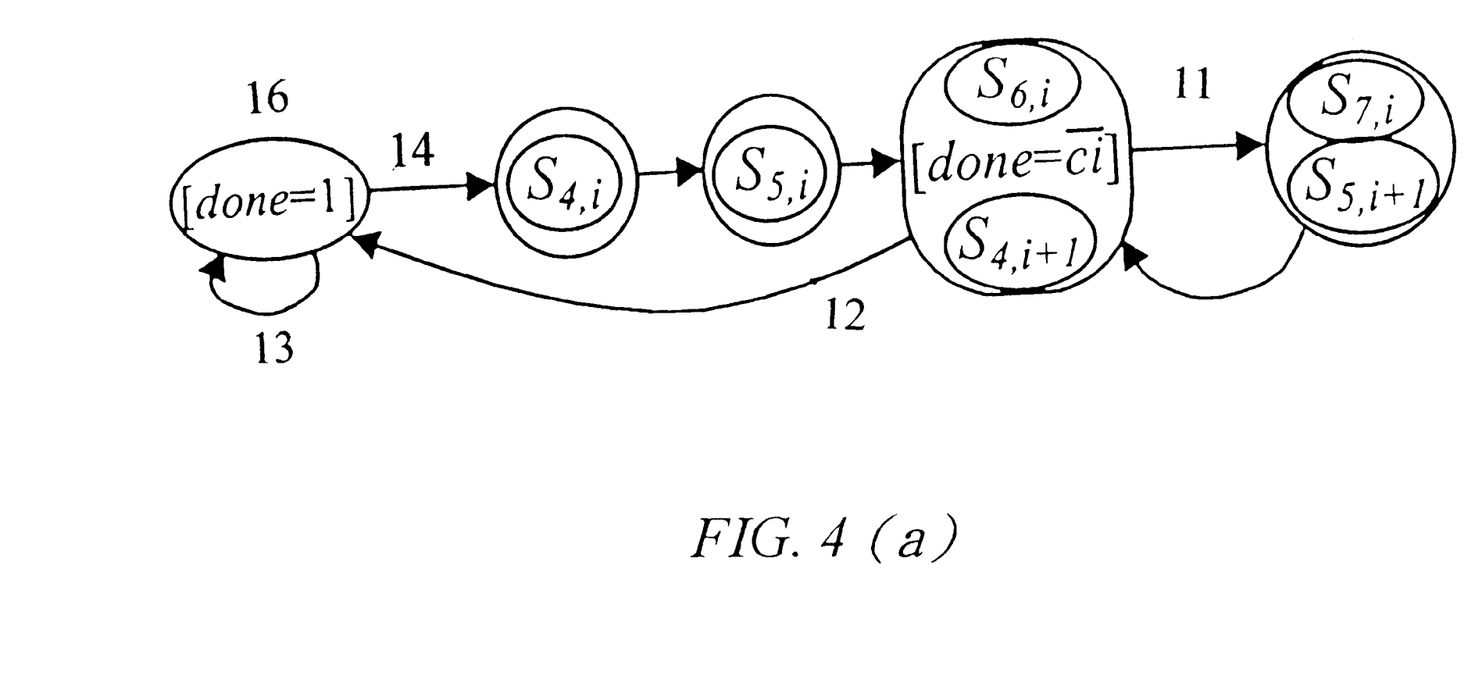
Figure 5:
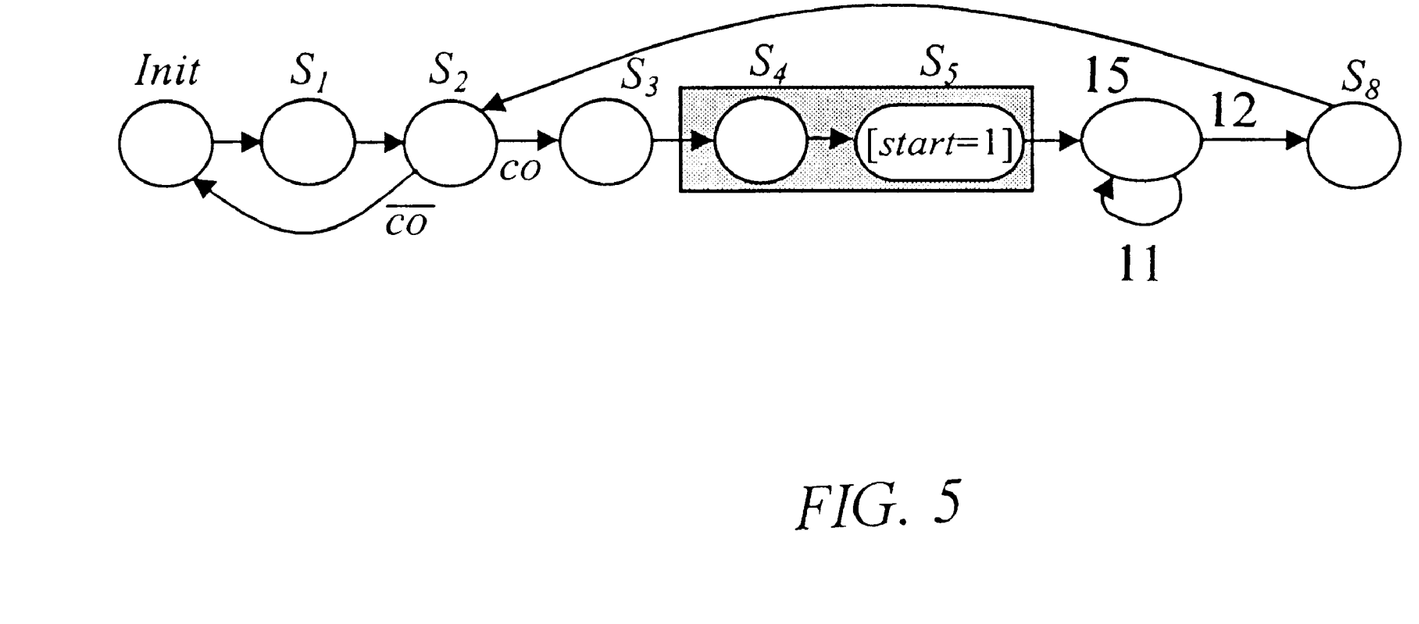
FIG. 5. The New $BSTG_o$ Derived After Prelude and Postlude of The $PBSTG_i$ Are Incorporated.

After pipelining the inner section, the generated $PBSTG_i$ consists of the prelude, repeating pipeline body, and postlude. These states in the prelude and postlude, which don't execute in the pipeline body of $PBSTG_i$, are removed and incorporated into $BSTG_o$ to further increase the $PBSTG_i$ performance. The modified $PBSTG_i$, after all states in prelude are removed, is shown in FIG. 4(b), and the modified $BSTG_o$ into which the states in prelude and postlude of $PBSTG_i$ have been incorporated is shown in FIG. 5. In it, the operation of setting signal start to 1 is moved to state $S_5$, the parent state of $Noop_i$. Note that in $BSTG_o$, after incorporating prelude and postlude states into $BSTG_o$, the operation of setting signal start to 1 must be moved to the parent state of $Noop_i$ to activate the $PBSTG_i$ correctly (see FIG. 5).

Step 3—Pipelining Design of The Outer Section

Given $BSTG_o$, the goal of outer section pipelining is to find the most compacted PBSTG that satisfies all precedence relations under the resource constraints. In other words, we want to find a repeating pipelining body for the $BSTG_o$. However, finding a repeating pipelining body for the outer section is quite difficult, since the execution times of its Noop state $Noop_i$, which represent the variant execution interval of inner $BSTG_i$ and is the main factor of requiring a dynamic pipelining design, is unknown (or data dependent) and the more complex interactive precedence relations between the two sections must also be considered. So, in addition to the conventional processing, there are some special and important processing must to be made for $Noop_i$ before starting outer section pipelining.

Figure 6:
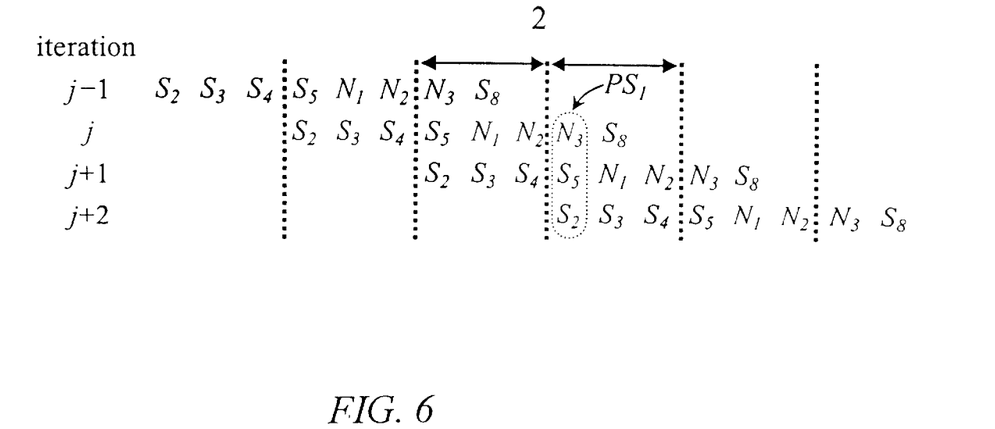
FIG. 6. The Result of Unwinding The Main Loop Body of FIG. 5 Four Times.

When incrementally unwinding the outer section loop to find the repeating pipelining body, some operations will be moved but cannot be migrated into its Noop states, and some new Noop states may be created and added to delay states and operations to make them satisfy the data/control dependencies between two sections, hardware constraints, and/or time constraints. To make pipelining (i.e., to find a repeating pipeline body) possible and to ensure that the inter-section precedence are satisfied, state $Noop_i$ in $BSTG_o$ must first expanded into consecutive $\alpha$ copies, $N_1, N_2, \ldots,$ and $N_\alpha$ before pipelining. The number, $\alpha$, of copies of state $Noop_i$ is determined as follows. We first calculate the distance, $D(x)$, between state x and the initial state of the $BSTG_o$ by the following equation:

$$D(x) = \begin{cases} 0, & \text{if } x \text{ is the initial state;} \\ \max_{\substack{s \in p(x) \\ s \neq x}} D(s) + 1, & \text{otherwise.} \end{cases} \quad [1]$$

where p(x) is the set of parent states of state x. Moreover, let $\Omega_{j+1}$ denote the state set of the (j+1)-th iteration of $BSTG_o$ that must be executed after state $Noop_{ij}$ due to some constraints (e.g. data/control dependencies or resource constraints). If the (j+1)-th iteration of $BSTG_o$ is initiated after L states (clock cycles) when the j-th iteration is initiated, and if state $S_{ij+1}$ is the state with the smallest distance among all states in $\Omega_{j+1}$. Then, the number of consecutive Noop states, $\alpha$, expanded in $BSTG_o$ is determined by the following equation:

$$\alpha = \begin{cases} L + D(S_{i,j+1}) - D(Noop_{i,j}), & \text{if } L + D(S_{i,j+1}) - D(Noop_{i,j}) > 0; \\ 1, & \text{otherwise.} \end{cases} \quad [2]$$

where $\alpha \geq 1$. After the expansion, state $S_{ij+1}$ is executed at the cycle with the child states of $Noop_{ij}$ to satisfy the constraints. Note that $\Omega_{j+1}$ will not be null since at least state $Noop_{ij+1}$ must be activated after state $Noop_{ij}$ to avoid different pipelined iterations of the inner section to execute concurrently. An example for the insertion sorter, which will be described in detail in the following, is given in FIG. 6.

After $\alpha$ copies $Noop_i$ are expanded into $BSTG_o$, we then pipeline it. We first unwind the outer section loop as much as possible and then extract all achievable parallelism by applying the conventional pipeline technique as revealed in Proc. of the ISCAS, pp. 1769–1772, 1991, by the inventors. However, full unwinding is sometime impractical when the iteration number of the outer section loop is large or unknown before execution. Moreover, the execution number of state $Noop_i$ in $BSTG_o$ is also unknown. Therefore, we incrementally unwind the loop to pipeline the outer section with unknown iteration times. As new iterations are brought in, some operations will be migrated to other states, and then the unwinding process forms PBSTGo gradually. The resource constraints and precedence relations among the operations limit these migrations. After a finite (and in practice small) number of iterations have been unwound and pipelined, a repeating pipeline body will provably emerge.

After the repeating pipeline body of the outer section is found, all BSTG states of different iterations which are executed at the same time are formed a $PBSTG_o$ state (see FIG. 6). Subsequently, some modifications for $PBSTG_o$ and $PBSTG_i$ must be done to maintain the original circuit behavior. First, we know that the operations of $PBSTG_i$ are activated when $PBSTG_o$ reaches the state that contains $N_1$. Therefore, the operation of enabling signal start (i.e., start=1) in $PBSTG_0$ must be moved to the parent state of the state which contains $N_1$ to activate the $PBSTG_i$ correctly. Second, since the execution length of $PBSTG_i$ is unknown, a new PBSTG Noop state $Noop_x$ must be added into $PBSTG_o$ between the state with $N_\alpha$ and its child state to wait $PBSTG_i$ terminating its operations so that the inter-section precedence can be met. Then, a final $PBSTG_o$ is generated (see FIG. 7).

Finally, when all states in the repeating pipeline body of $PBSTG_o$ contain some $N_i$, $1 \leq i \leq \alpha$, the operation start=1 will be activated at state $Noop_x$ of $PBSTG_o$. This will require that $PBSTG_i$ must be activated immediately without going to state $Noop_o$ when it completes its operations. Therefore, the original $PBSTG_i$ must be modified as follows. First, a new edge labeled done^ start must be added into the transition edge from state $PS_y$ to the child state of state $Noop_o$, where $PS_y$ is the branch state of $PBSTG_i$ with outgoing edges labeled done and $\overline{done}$. Additionally, a new edge label done^ start must replace the old edge label done in $PBSTG_i$ so that $PBSTG_o$ can activate it correctly.

Figure 7:
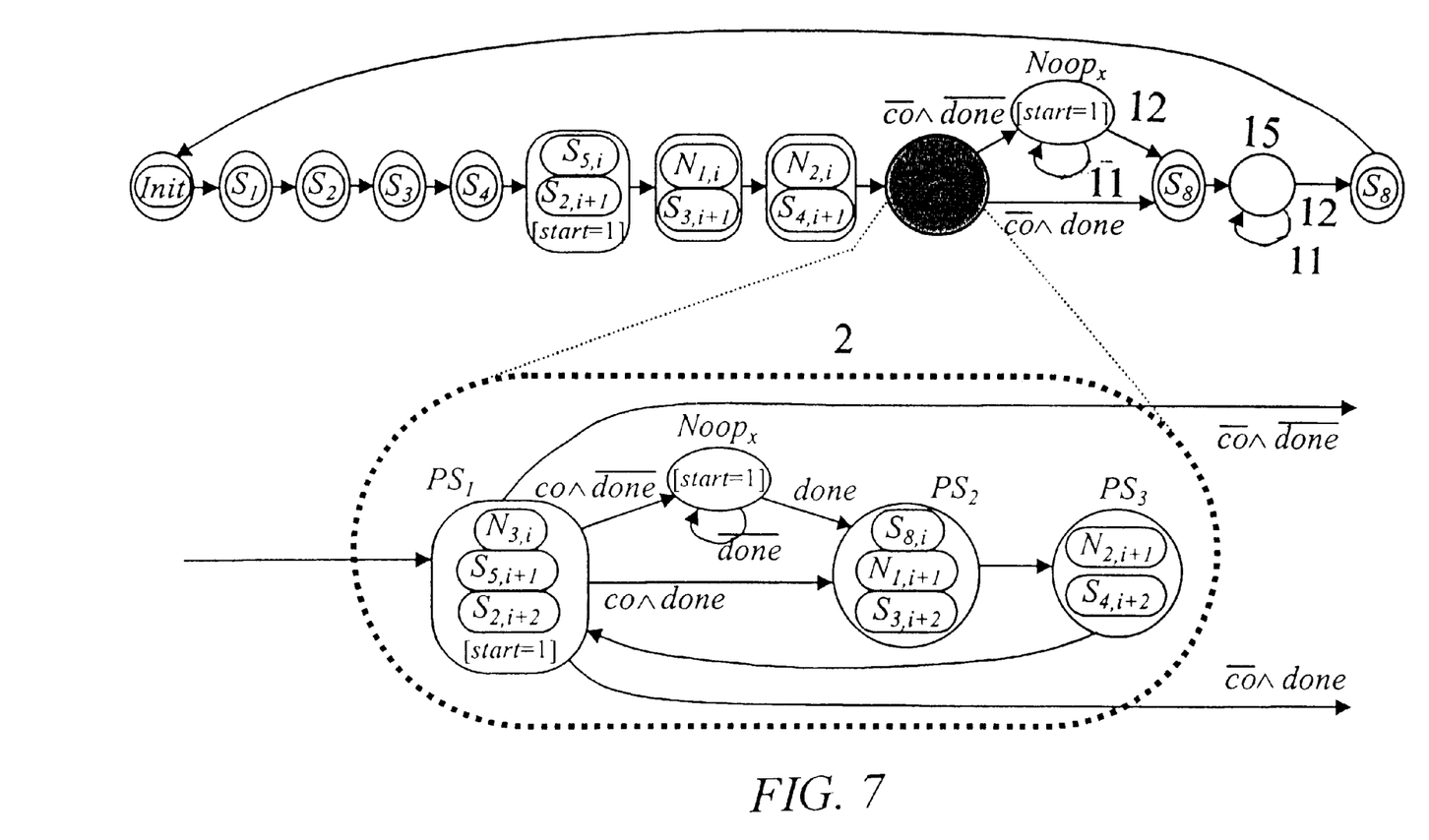
FIG. 7. Insertion Sorter's Final $PBSTG_o$.
Figure 8:
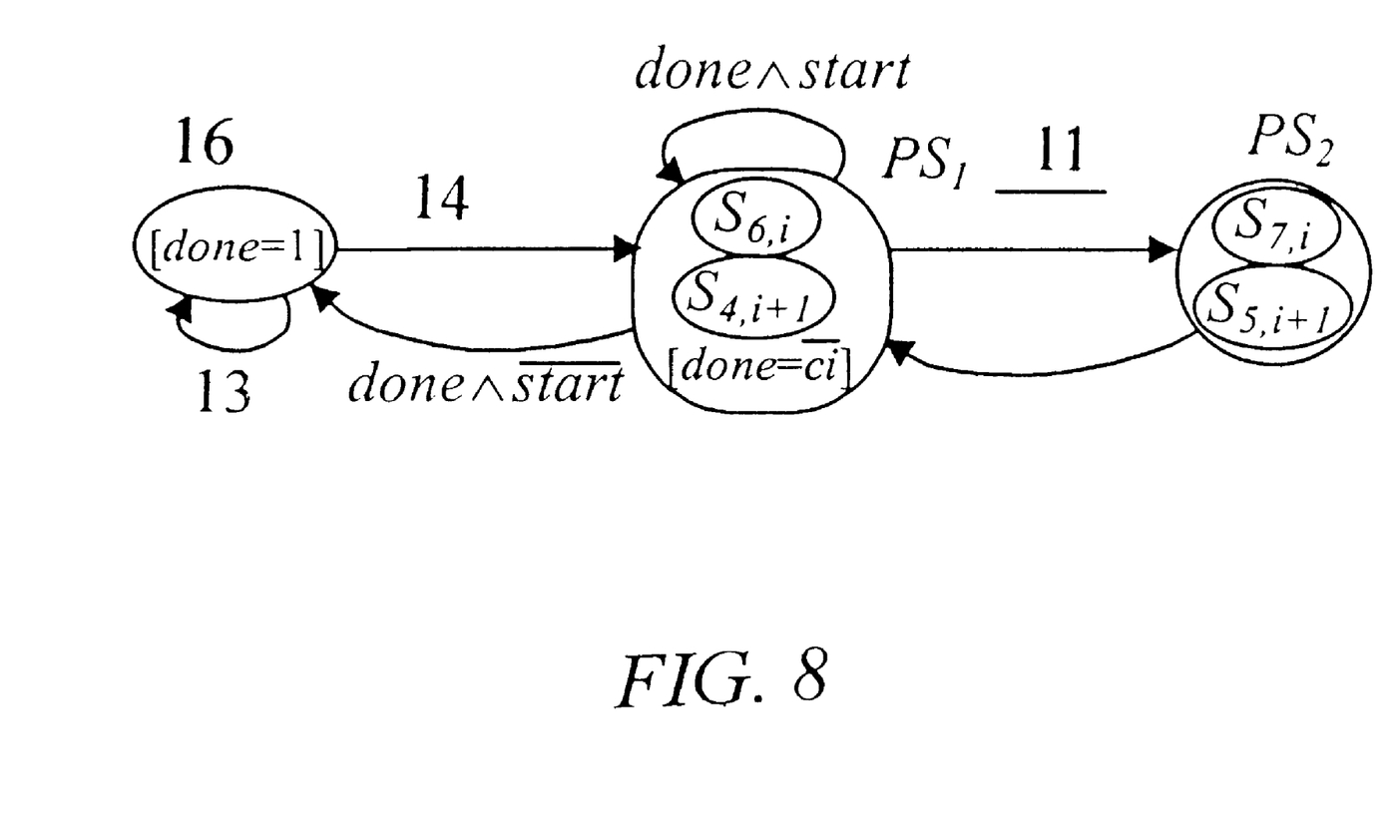
FIG. 8. Insertion Sorter's Final $PBSTG_i$.

Consider the $BSTG_o$ shown in FIG. 5, assume that a memory with one read and one write port is allocated in the datapath. The initial pipeline latency of $BSTG_o$ is 3 (i.e., L=3) due to the delay constraint (i.e., 1 clock cycle) of the memory and the usage constraint of the reading address register of the memory. In $BSTG_o$, state $Noop_i$ of the current iteration must be activated after state $Noop_i$ of the previous iteration (i.e. $\Omega_{j+1} = \{Noop_{ij+1}\}$), then the original Noop state is expanded into $\alpha=3+5-5=3$ consecutive Noop states $N_1$, $N_2$, and $N_3$, see FIG. 6, which shows the four times unwinding of the outer section loop. During the incremental unwinding, no new state is created and no operation is migrated. FIG. 7 shows the final $PBSTG_o$, and each $BSTG_o$ state in its repeating pipeline body has been labeled with iteration index subscripts. In FIG. 7, a new PBSTG Noop state, $Noop_x$, has been inserted between state $PS_1$ and its child state $PS_2$. Moreover, the operation of start=1 is copied from state $PS_1$ to state $Noop_x$ since it also is the parent state of state $PS_2$ which contains $N_1$. Finally, since all states in the repeating pipeline body of the final $PBSTG_o$ contain some $N_i$, the $PBSTG_i$ of FIG. 4(b) must be modified into FIG. 8 to activate the inner section correctly.

Step 4—Design of Pipelined Datapath

The technique as revealed by inventors in Proc. of the ISCAS, pp. 1769–1772, 1991, is used to design dynamic pipelining datapath. Before describing the design process, the invention first defines the concurrent state pair between the $PBSTG_o$ and the $PBSTG_i$ as follows. If state $PS_m$ of $PBSTG_o$ contains a Noop state of $BSTG_o$, then it would be concurrently activated with one certain state $PS_n$ of $PBSTG_i$. The invention calls states $PS_m$ and $PS_n$ as a concurrent state pair. In dynamic pipelining, except that the operations in the concurrent state pair or at the same state cannot share the same hardware unit, all other operations at different states of $PBSTG_o$ and/or $PBSTG_i$ can share the same hardware. Therefore, after locating all the concurrent state pairs, the method aforementioned as revealed by the inventors in 1991 can be applied to undertake the design work.

All concurrent state pairs between $PBSTG_o$ and $PBSTG_i$ can be found by constructing execution trace lists T's of $PBSTG_i$. Each element of T's corresponds to one state of $PBSTG_i$. Let the child state of state $Noop_o$ of $PBSTG_i$ correspond to the first element of each T, the execution trace list is constructed by enumerating all possible executing paths of length $\alpha-1$ in $PBSTG_i$ from the first element. Assume the level of the first element in the list is 1, each list is terminated when the level of its last element is $\alpha$. After all T's are constructed, then the state $PS_m$ of $PBSTG_o$ which contains BSTG Noop state $N_i$ and the state $PS_n$ in some T whose level is i are a concurrent state pair, denoted as $<PS_m^o, PS_n^i>$. For the insertion sorter example, the only list T constructed is $PS_1-PS_2-PS_1$. By the T, the concurrent state pairs found are $<PS_2^o, PS_1^i>$, $<PS_3^o, PS_2^i>$, and $<PS_1^o, PS_1^i>$.

Step 5—Design of Dynamic Pipeline Controller

Lastly, based on the results of the action sequence determined by dynamic pipeline scheduling as represented in $PBSTG_o$ and $PBSTG_i$ and the results of pipelined datapath above, the invention designs a controller to control the execution of the datapath hardware units. The controller consists of the two parts: the outer controller (6) and inner controller (3). The outer controller (6) and the inner controller (3) are inferred from the $PBSTG_o$ and the $PBSTG_i$ respectively. The interactive signals start and done between them are used to coordinate the actions of the two controllers. The signal start is set by the outer controller (6). When the outer controller (6) is at the parent states, $\theta$, of the state that contains Noop state $N_1$, signal start is set as 1 for enabling the execution of $PBSTG_i$ of the equation as shown below. Let the parent state be represented by $\theta$:

$$start = \begin{cases} 1, & \text{if } PBSTG_0 \text{ is at state } \theta; \\ 0, & \text{otherwise.} \end{cases} \quad [3]$$

Signal done is set by the inner controller (3). When the $PBSTG_i$ is at state $Noop_o$ or at the state, $\pi$, generating condition ci and ci=0. signal done is set as 1, that is:

$$done = \begin{cases} 1, & \text{if } PBSTG_i \text{ is at state } Noop_o \text{ or is at state } \pi \text{ and } ci = 0; \\ 0, & \text{otherwise.} \end{cases} \quad [4]$$

The pipelined datapath is jointly controlled by the inner controller (3) and the outer controller (6). These two controllers may, at the same time, send out different control signals to the same hardware unit such as ALUs, state registers, or MUXs. The phenomenon above is called control conflicts. For a hardware unit X having such control conflicts, the invention's solution is to use a MUX, which will be controlled by the outer controller, to choose the unit's control signals from the inner or from the outer controller. Assume that the MUX uses signal run as its select signal, and when run is 0, the control signals from the outer controller are selected to control the unit X; otherwise, the control signals are generated by the inner controller. Then, the outer controller will enable signal run at state $Noop_x$, since the inner controller has the supremacy of datapath at that time. In addition, run is also enabled when the outer controller reaches one of the concurrent states set $\Delta_i$ at which the unit X is allocated to do some operations of $PBSTG_j$. That is, signal run for solving the control conflict of unit X, denoted as run(X), is generated by $$run(X) = \begin{cases} 1, & \text{if } PBSTG_o \text{ is at state } Noop_x \text{ or at } \Delta_i; \\ 0, & \text{otherwise.} \end{cases} \quad [5]$$

Figure 9:
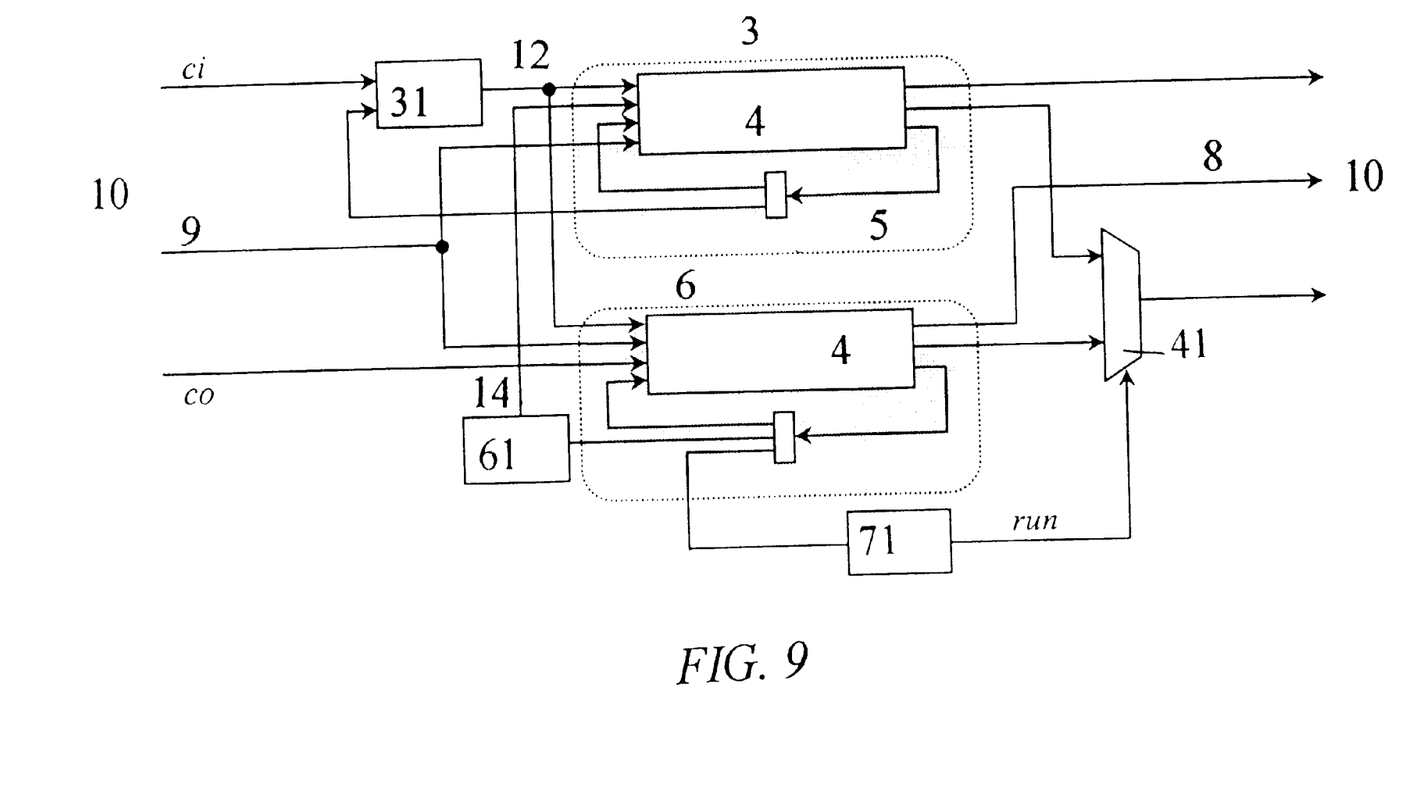
FIG. 9. Controller Architecture of Dynamic Pipelining Design.

FIG. 9 shows the basic architecture of the dynamic pipeline controller. Nonetheless, the design of the dynamic pipeline controller does not necessarily have to be divided into the two parts of the inner (3) and outer controllers (6), the $PBSTG_i$ and $PBSTG_o$ can be merged into a single PBSTG similar to the one in FIG. 7 to form an integrated controller.

DESIGN EXAMPLE & DESCRIPTION OF EXPERIMENT RESULTS

To explain the performance of the proposed dynamic pipelining method, the invention had separately designed the traditional sequential and the dynamic pipelining circuits for three ASIC examples of an adaptive binary arithmetic coding circuit, an insertion sorter, and a fuzzy logic color correction circuit. Note that all these examples cannot be pipelined without using the proposed dynamic pipelining method due to their variant-execution-time inner sections. The performances and costs are analyzed and compared in the following.

Figure 10:
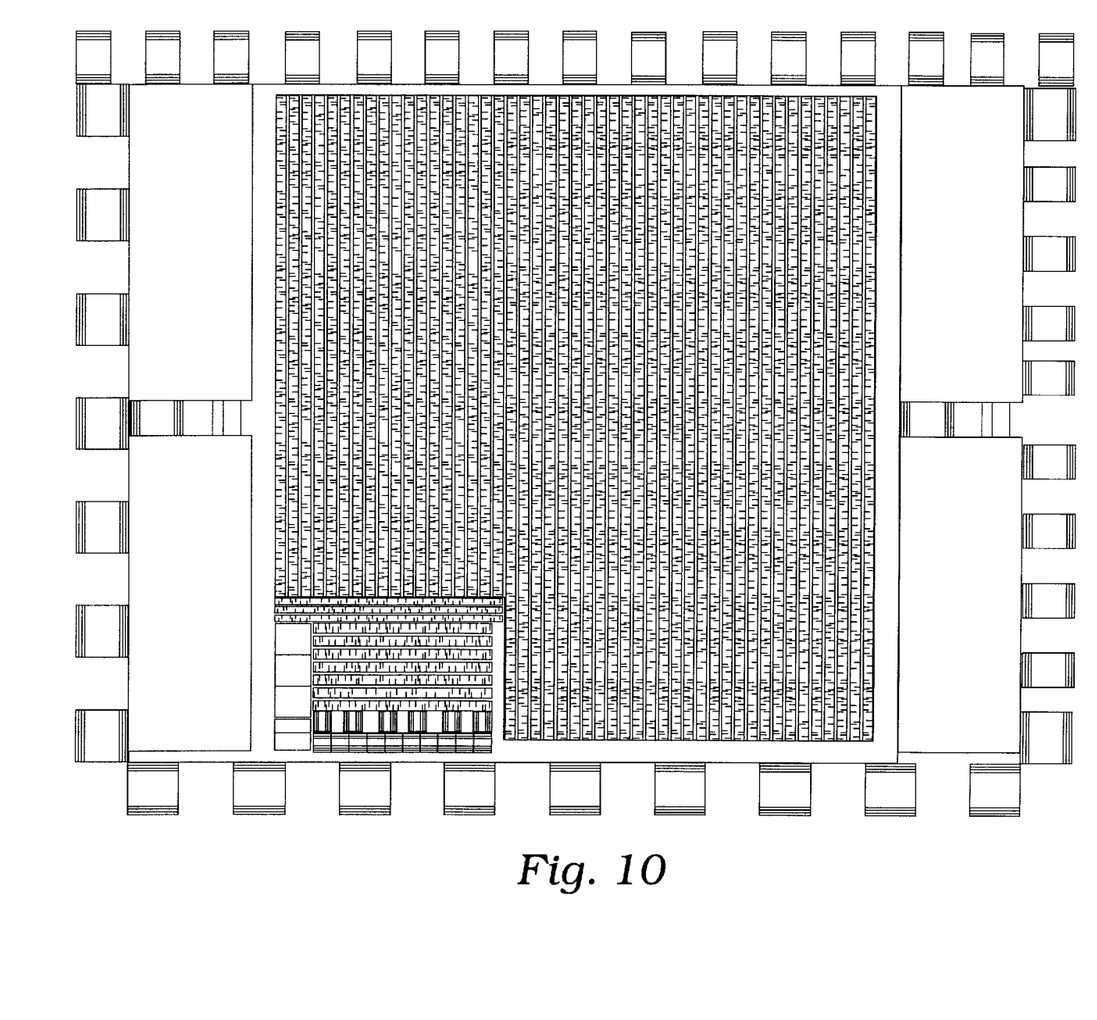
FIG. 10. Layout of Dynamic Pipelining Binary Arithmetic Coding Chip.

For the two different binary arithmetic coding circuits, the invention applied three different categories of 12 files for the compression experiment. The results are as shown in Table 1. The "C-ratio" in Table 1 represents the data compression rate; "C-speed (S)" and "C-speed (P)" indicate the compression speeds of the sequential design and dynamic pipelining design, respectively. The sequential design follows the conventional digital circuit design method for sequential circuits. The results as shown in Table 1 reveal that about two times of speedup for the dynamic pipelining design can be achieved. In terms of the layout area cost, the layout of the dynamic pipelining arithmetic coding circuit used about 65 k resistors as shown in FIG. 10 and the sequential one used about the 54k resistors as revealed by S. R. Kuang, et al. in *IEEE Transactions on Circuits & Systems Part I*, Vol. 45, No. 7, pp.693–706, 1998, the dynamic pipelining design increases about 20% of area. However, when compared with the performance, the increase is acceptable. In terms of cycle time, although the dynamic pipelining design will increase the controller's complexity, on the surface, the cycle time would appear to be stretched out, however, pipelining datapath can be used to shorten the cycle time of datapath like the high performance circuits designed with the conventional pipelining method. Therefore, the cycle time values in both the arithmetic coding circuit's dynamic pipelining and sequential designs are equal, and that is the same for all other design examples below.

Where concerns the insertion sorters, the invention used eight sets of data (Data 1~Data 8) to verify them. Data 1 and Data 5 contain the data already arranged in order; Data 2 and Data 6 contains inverse order of values of data while Data 3, Data 4, Data 7 and Data 8 contain data of random order. The experiment results are as shown in Table 2. In Table 2, "Data Size" means the number of data that needs to be sorted while "sequential" and "dynamic pipelining" represent the number of processing clock cycles required for the sequential and dynamic pipelining designs to sort all data, respectively. Meanwhile, The column "speedup" shows the speedup of the dynamic pipelined design comparing with the sequential one; the results show that about 1.9 times of time speedup can be obtained. For the increased hardware cost, dynamic pipelining design only uses 9 more state registers than the sequential one; in terms of the size of controller, the sequential design has 9 control states while 16 states for dynamic pipelining design; however, the corresponding state registers are not increased. Considering the time-efficiency enhancement, these additional hardware increases of dynamic pipelining design are of acceptable level.

For fuzzy logic color correction circuits, the invention uses four pictures of different sizes in the experiment. The experiment results are given in Table 3. In it, $\overline{L}$ represents the average dynamic pipeline latency. The "sequential" and "dynamic pipelining" represent the number of processing clock cycles required for sequential and dynamic pipelining designs, respectively. The results show that about 2 times of time speed can be obtained. Dynamic pipelining design only uses 3 more state registers than the sequential one; in addition, one additional divider and multiplier are used in the dynamic pipelining design. In terms of the size of controller, the sequential design has with 13 states while 22 states for the dynamic pipelining design; yet, only one additional state register is added. Considering the time-efficiency enhancement, these additional hardware increases of dynamic pipelining design also are of acceptable level.

Based on the results of the design cases above, the dynamic pipelining method indeed can efficaciously enhance the time-efficiency of circuits. The area overhead created by the new method is comparable to that of the traditional pipelining method: it would increase the number of state registers; might increase the number of certain components; the control circuit would be more complex, which are the results compared against the sequential method. Thus, the increased hardware cost of the new method is acceptable, which is also why all high performance circuits (such as CPU) are designed by pipelining.

Features & Functions

The main features of the dynamic pipelining design method presented by the invention for digital circuits lie with that it uses variant latencies and efficient design procedures to pipeline execution-time-variant ASIC loops' to achieve the goal of higher pipeline performance-efficiency, and a special controller comprising two interactive finite state machines or a single integrated finite state machine is proposed. In addition, in contrast to the time-efficiency enhancement derived, the increased cost is few extra hardware units. Nonetheless, compared with the conventional pipelining method, the increase of cost is the same, yet the effects of performance improvement thus obtained is greater than the losses caused by the increased hardware units. Therefore, the invention is rather suitable for enhancing the time efficiency of application specific integrated circuits with execution-time-variant loops.

What is claimed is:

1. A type of dynamic pipelining method that is applied in pipelining the execution-time-variant loops in a circuit, including:
   (a) segmentation of BSTG: use BSTG to build a corresponding model for a behavior of the circuit to be pipelined, and divide the built BSTG model into two parts; one, an outer section ($BSTG_o$); the other an inner section of execution time-variant ($BSTG_i$);
   (b) pipelining a design of the inner section: a $BSTG_i$ is pipelinely designed, and then the pipelined BSTG is generated and is represented using $PBSTG_i$;
   (c) pipelining a design of the outer section: a $BSTG_i$ is pipelinely designed, and then the pipelined BSTG is generated and is represented using $PBSTG_i$;
   (d) design of a pipelined datapath: after pipelining treatment of the outer and inner sections, hardware allocation is done on $PBSTG_i$ and $PBSTG_o$ to build a dynamic pipelined datapath; and
   (e) design of dynamic pipeline controller: then, use $PBSTG_i$ to design an inner section controller, and use PBSTGo to design an outer section controller; use the two controllers or integrate the two controllers into a single controller along with coordinated control signals start, done and run to form a dynamic pipeline control circuit.

2. The dynamic pipelining method of claim 1, wherein the BSTG is a directional cyclic graph with vertices representing states, and edges representing state transition; and labels on the edges indicating conditions for triggering state transition.

3. The dynamic pipelining method of claim 1, further including the steps of partitioning the iteration-times-fixed outer section and the iteration-times-variant inner part of the circuit's loops; and converting the iteration-times-fixed outer section into BSTGo and the iteration-execution-time-variant inner section into BSTGi.

4. The dynamic piplining method of claim 1, in which, the PBSTGi is used to pipeline the BSTGi by unwinding loop's iterations, to find an inner section's piplining loop body.

5. The dynamic piplining method of claim 4 further comprising the steps of starting execution time of the outer section's every iteration as affected by variant-execution-time of the inner section; inserting the PBSTGo $\alpha$ numbers of Noop state representing the number of states required for executing the inner section; in which, $\alpha$ also indicates the maximum number of states that the inner and outer sections are piplinely executed concurrently; and after the insertion, the piplining method is applied to pipeline BSTGo with the inserted $\alpha$ Noop states to locate the outer section's piplining loop body.

6. The dynamic pipelining method of claim 1, in which, the hardware allocation process for the inner and outer sections does interconnection, register, and function unit allocations.

7. The dynamic piplined datapath design method of claim 1, further comprising the step of using the PBSTGi and PBSTGo coordinates to produce a dynamic pipelined circuit.

8. A digital circuit that performs dynamic pipeline control, including an inner controller, an outer controller, and circuits that generate control signals start, done, and run, to form a dynamic pipeline control circuit; the outer controller is inferred from PBSTGo and the inner controller is inferred from PBSTGi; signals start and done are generated by the inner controller and the outer controller, respectively, while signal run is used for resolving control conflicts between signals start and done to prevent the inner controller and the outer controller from generating control signals on the same digital circuit at the same time.

9. The control circuit of claim 8, wherein the control circuit's inner controller and outer controller are incorporated into a single controller; the integrated controller is derived from the merging of PBSTGi and PBSTGo, and combines the functions of two inner and outer controllers.

* * * * *